US009064885B2

(12) United States Patent
Bu et al.

(10) Patent No.: US 9,064,885 B2
(45) Date of Patent: Jun. 23, 2015

(54) ELECTROSTATIC DISCHARGE RESISTANT DIODES

(71) Applicant: International Business Machines Corporation, Armonk, NY (US)

(72) Inventors: Huiming Bu, Millwood, NY (US); Robert J. Gauthier, Jr., Hinesburg, VT (US); Terence B. Hook, Jericho, VT (US); Effendi Leobandung, Wappingers Falls, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/036,393

(22) Filed: Sep. 25, 2013

(65) Prior Publication Data

US 2014/0167203 A1 Jun. 19, 2014

Related U.S. Application Data

(63) Continuation of application No. 13/714,404, filed on Dec. 14, 2012.

(51) Int. Cl.
| | |
|---|---|
| *H01L 29/861* | (2006.01) |
| *H01L 29/66* | (2006.01) |
| *H01L 29/74* | (2006.01) |
| *H01L 29/06* | (2006.01) |
| *H01L 27/02* | (2006.01) |

(52) U.S. Cl.
CPC ........ *H01L 29/66121* (2013.01); *H01L 29/861* (2013.01); *H01L 29/66136* (2013.01); *H01L 29/66393* (2013.01); *H01L 29/7436* (2013.01); *H01L 29/8611* (2013.01); *H01L 29/0649* (2013.01); *H01L 27/0255* (2013.01); *H01L 27/0262* (2013.01)

(58) Field of Classification Search
CPC ...................................... H01L 29/861
USPC .................. 257/E27.051, E29.327, E25.002, 257/E21.053, E21.352, E21.358, 350
See application file for complete search history.

(56) References Cited

U.S. PATENT DOCUMENTS

| | | | |
|---|---|---|---|
| 6,974,729 B2 | 12/2005 | Collaert et al. | 438/157 |
| 7,368,354 B2 | 5/2008 | Anderson et al. | 438/283 |
| 7,786,650 B2 | 8/2010 | Takasan et al. | 365/148 |

(Continued)

OTHER PUBLICATIONS

Fried et al., "Improved Independent Gate N-Type FinFET Fabrication and Characterization", IEEE Electron Device Letters, vol. 24, No. 9, Sep. 2003.
J. Han et al. "A Bulk FinFET Unified-RAM (URAM) Cell for Multifunctioning NVM and Capacitorless 1T-DRAM", IEEE Electron Device Letters, vol. 29, No. 6, Jun. 2008.

*Primary Examiner* — Ha Tran T Nguyen
*Assistant Examiner* — Aaron Dehne
(74) *Attorney, Agent, or Firm* — Ido Tuchman; Vazken Alexanian (57) ABSTRACT

A diode and a method for an electrostatic discharge resistant diode. The method includes, for example, receiving a wafer. The wafer includes a silicon layer electrically isolated from a silicon substrate by a buried oxide (BOX) layer. The BOX layer is in physical contact with the silicon layer and the silicon substrate. An N-type well is implanted in the silicon substrate. Furthermore, a vertical column of P+ doped epitaxial silicon and a vertical column of N+ doped epitaxial silicon are formed over the N-type well and extend through the BOX layer and the silicon layer. Both vertical columns may form electrical junctions with the N-type well.

11 Claims, 7 Drawing Sheets

(56) References Cited

U.S. PATENT DOCUMENTS

| | | | |
|---|---|---|---|
| 7,968,971 B2 | 6/2011 | Chung et al. | 257/586 |
| 2006/0284278 A1* | 12/2006 | Min et al. | 257/506 |
| 2009/0256207 A1 | 10/2009 | Chen et al. | 257/365 |
| 2010/0052100 A1* | 3/2010 | Barth et al. | 257/538 |
| 2011/0115023 A1 | 5/2011 | Cheng et al. | 257/350 |
| 2011/0121366 A1 | 5/2011 | Or-Bach et al. | 257/204 |
| 2011/0147794 A1* | 6/2011 | Gauthier et al. | 257/162 |
| 2011/0156142 A1 | 6/2011 | Teo et al. | 257/336 |
| 2012/0261804 A1* | 10/2012 | Li et al. | 257/653 |

\* cited by examiner

ELECTROSTATIC DISCHARGE RESISTANT DIODES

CROSS-REFERENCE TO RELATED APPLICATIONS

This application claims priority under 35 U.S.C. §120 to U.S. patent application Ser. No. 13/714,404 filed Dec. 13, 2012, the entire text of which is specifically incorporated by reference herein.

BACKGROUND

The present invention relates to diodes, and more particularly to electrostatic discharge resistant diodes and methods for their construction.

Conventional diodes in CMOS platforms are often formed over an exposed oxide (PAD) layer. The PAD layer is electrically isolated from a silicon substrate by a buried oxide (BOX) layer. Typically, diodes formed over PAD layers are susceptible to damage through electrostatic discharge.

BRIEF SUMMARY

Accordingly, one example of the present invention is a method for forming an electrostatic discharge resistant diode. The method includes a receiving a wafer that includes a silicon layer electrically isolated from a silicon substrate by a buried oxide (BOX) layer. The BOX layer is in physical contact with the silicon layer and the silicon substrate. An implanting step implants an N-type well in the silicon substrate. Furthermore, a forming step forms a first vertical column of P+ doped epitaxial silicon over the N-type well. The first vertical column extends through the BOX layer and the silicon layer. Another forming step forms a second vertical column of N+ doped epitaxial silicon over the N-type well. The second vertical column extends through the BOX layer and the silicon layer.

Another example of the present invention is an electrostatic discharge resistant diode. The diode includes a wafer and an N-type well in the silicon substrate of the wafer. Furthermore, the diode includes a vertical column of P+ doped epitaxial silicon and a vertical column of N+ doped epitaxial silicon over the N-type well. Both columns extend through the BOX layer and the silicon layer and form electrical junctions with the N-type well.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-5C. When referring to the figures, like structures and elements shown throughout are indicated with like reference numerals.

Figure 1:
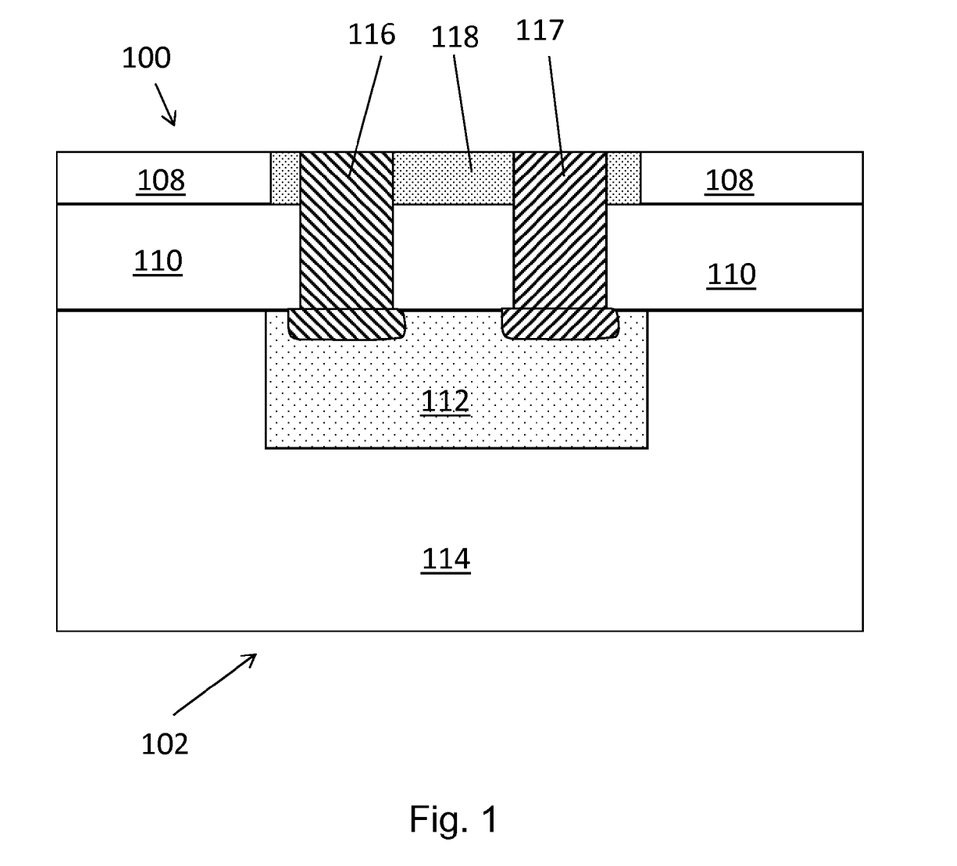
FIG. 1 shows an example electrostatic discharge resistant diode contemplated by the present invention.

FIG. 1 shows an example electrostatic discharge resistant diode 100 contemplated by the present invention. The diode 100 includes a wafer 102. The wafer 102 includes a silicon layer 108 electrically isolated from a silicon substrate 114 by a buried oxide (BOX) layer 110. The BOX layer 110 is in physical contact with the silicon layer 108 and the silicon substrate 114. Furthermore, a N-type well 112 is implanted in the silicon substrate 114. A first vertical column of P+ doped epitaxial silicon 116 and a second vertical column of N+ doped epitaxial silicon 117 are formed over the N-type well 112. Both columns 116 and 117 extend through the BOX layer 110 and the silicon layer 108 and form electrical junctions with the N-type well 112. The columns 116 and 117 are electrically isolated from the silicon layer 108 by a dielectric layer 118, such a $SiO_2$.

Figure 2:
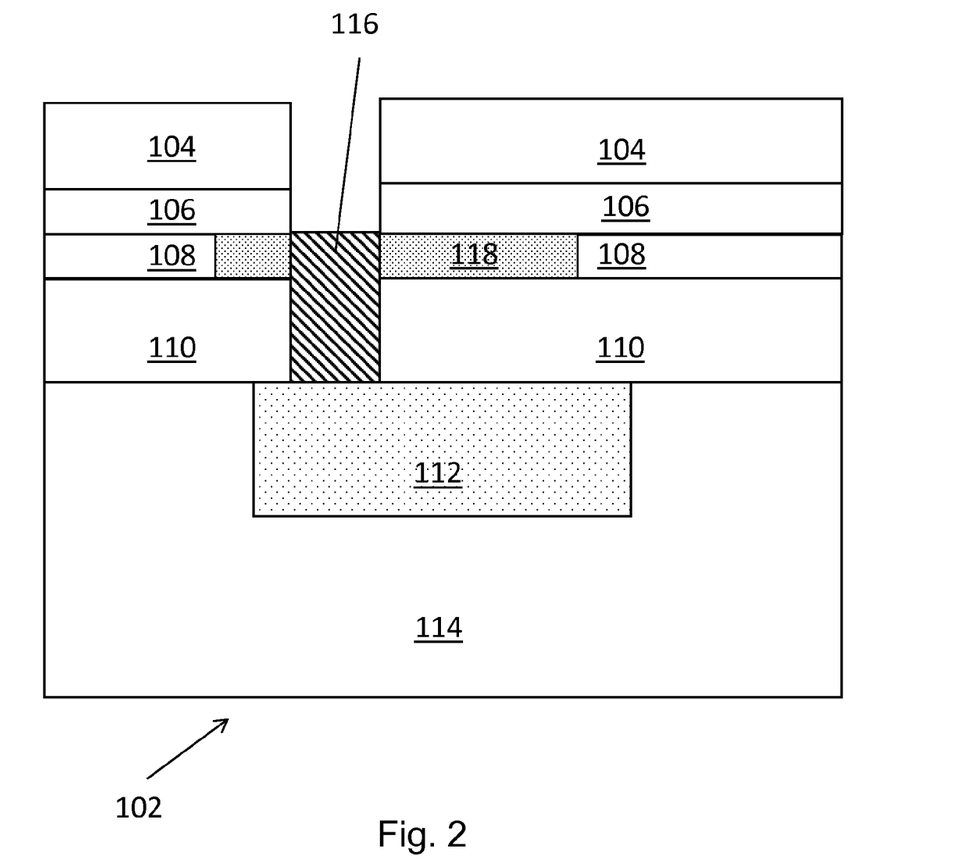
FIG. 2 shows an example intermediate step in constructing the electrostatic discharge resistant diode in accordance with one embodiment of the present invention.

FIG. 2 shows an example intermediate step in constructing the electrostatic discharge resistant diode 100 in accordance with one embodiment of the present invention. The wafer 102 includes a first exposed oxide (PAD) layer 106 over the silicon layer 108 and a first photoresist layer 104 over the first PAD layer 106. Furthermore, the first vertical column of P+ doped epitaxial silicon 116 is formed over the N-type well 112 and extends through the BOX layer 110 and the silicon layer 108. In one embodiment, the BOX layer 110 may comprise silicon oxide. The first PAD layer 106 may comprise silicon oxide. The first vertical column of P+ doped epitaxial silicon 116 may comprise boron-doped epitaxial silicon.

Figure 3:
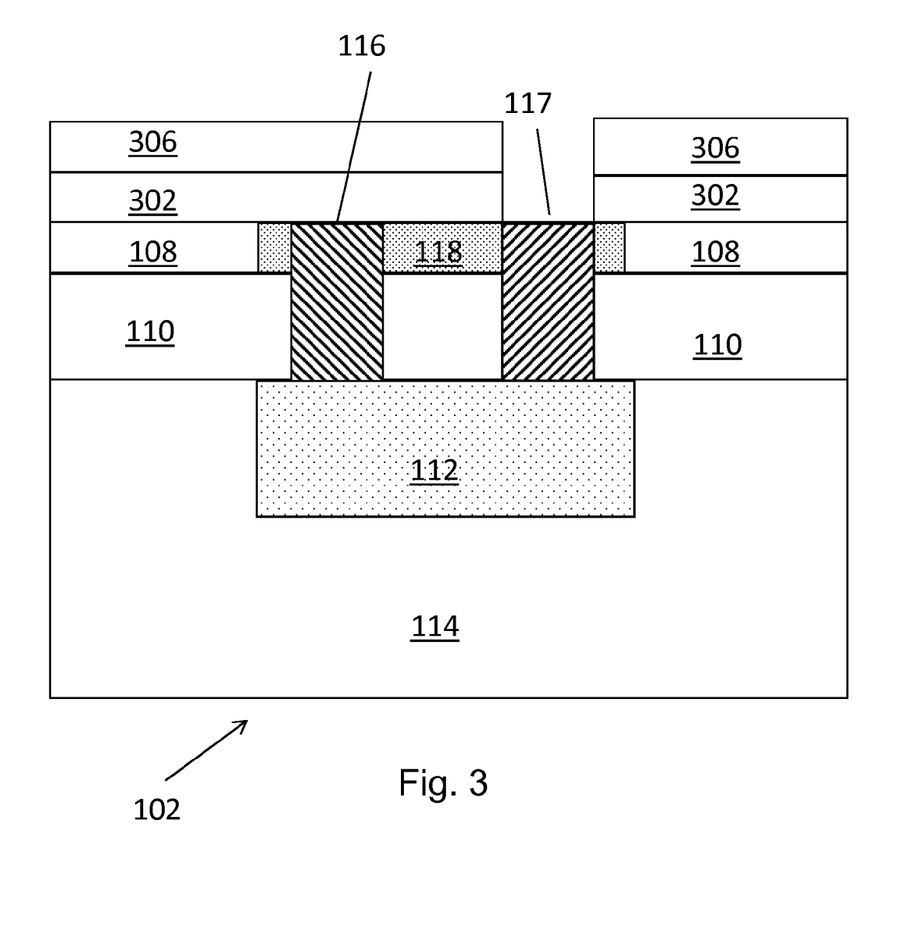
FIG. 3 shows another example intermediate step in constructing the electrostatic discharge resistant diode in accordance with one embodiment of the present invention.

FIG. 3 shows another example intermediate step in constructing the electrostatic discharge resistant diode 100 in accordance with one embodiment of the present invention. As shown, the wafer 102 includes a second exposed oxide (PAD) layer 302 over the silicon layer 108 and a second photoresist layer 306 over the second PAD layer 302. Furthermore, the second vertical column of N+ doped epitaxial silicon 117 is formed over the N-type well 112 and extends through the BOX layer 110 and the silicon layer 108. In one embodiment, the second PAD layer 302 may comprise silicon oxide. The second vertical column of N+ doped epitaxial silicon 117 may comprise phosphorus-doped epitaxial silicon.

Figure 4:
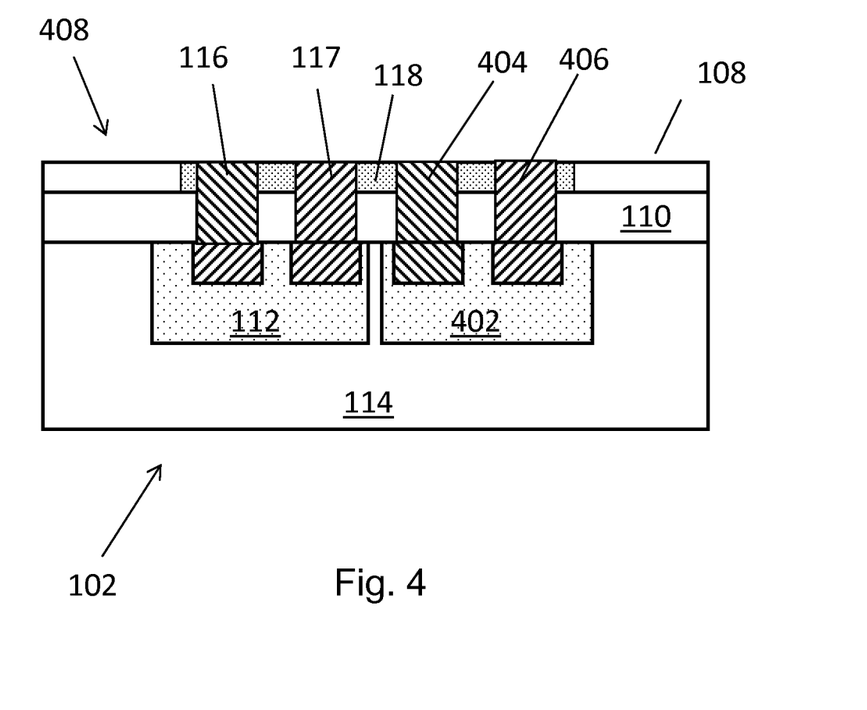
FIG. 4 shows an example electrostatic discharge resistant silicon-controlled rectifier (SCR) contemplated by the present invention.

FIG. 4 shows an example electrostatic discharge resistant silicon-controlled rectifier (SCR) 408 contemplated by the present invention. According to this embodiment of the invention, the SCR 408 includes a wafer 102. The wafer 102 includes a silicon layer 108 electrically isolated from a silicon substrate 114 by a buried oxide (BOX) layer 110. The BOX layer 110 is in physical contact with the silicon layer 108 and the silicon substrate 114. Furthermore, a pair of N-type well 112 and P-type well 402, next to each other, are implanted in the silicon substrate 114. A first vertical column of P+ doped epitaxial silicon 116 and a second vertical column of N+ doped epitaxial silicon 117 are formed over the N-type well 112 and extend through the BOX layer 110 and the silicon layer 108. A third vertical column of P+ doped epitaxial silicon 404 and a fourth vertical column of N+ doped epitaxial silicon 406 are formed over the P-type well 402 and extend through the BOX layer 110 and the silicon layer 108. All the four columns also may form electrical junctions with the underneath N-type well 112 or P-type well 402 respectively.

Figure 5A:
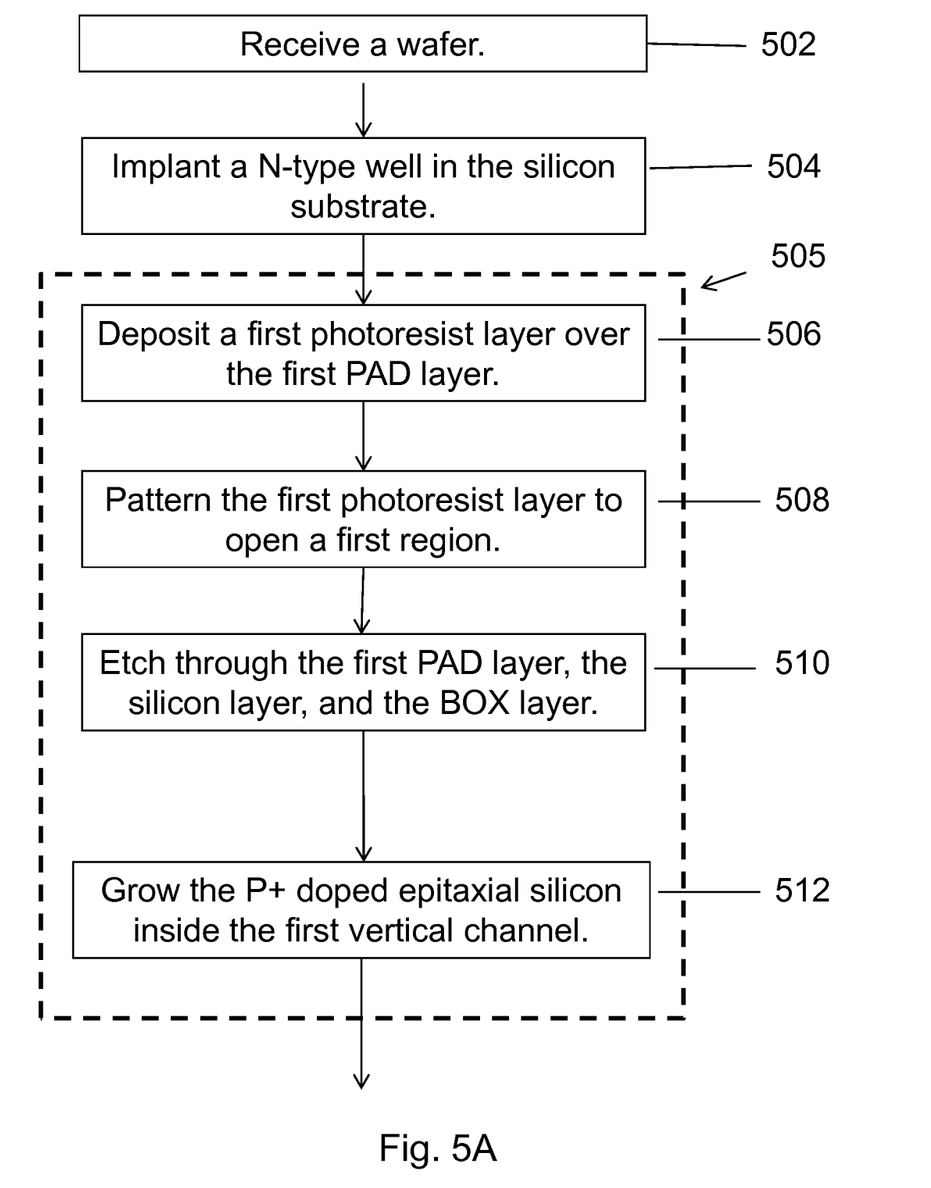
FIGS. 5A-5C shows a method for forming an electrostatic discharge resistant diode in accordance with one embodiment of the present invention.
Figure 5B:
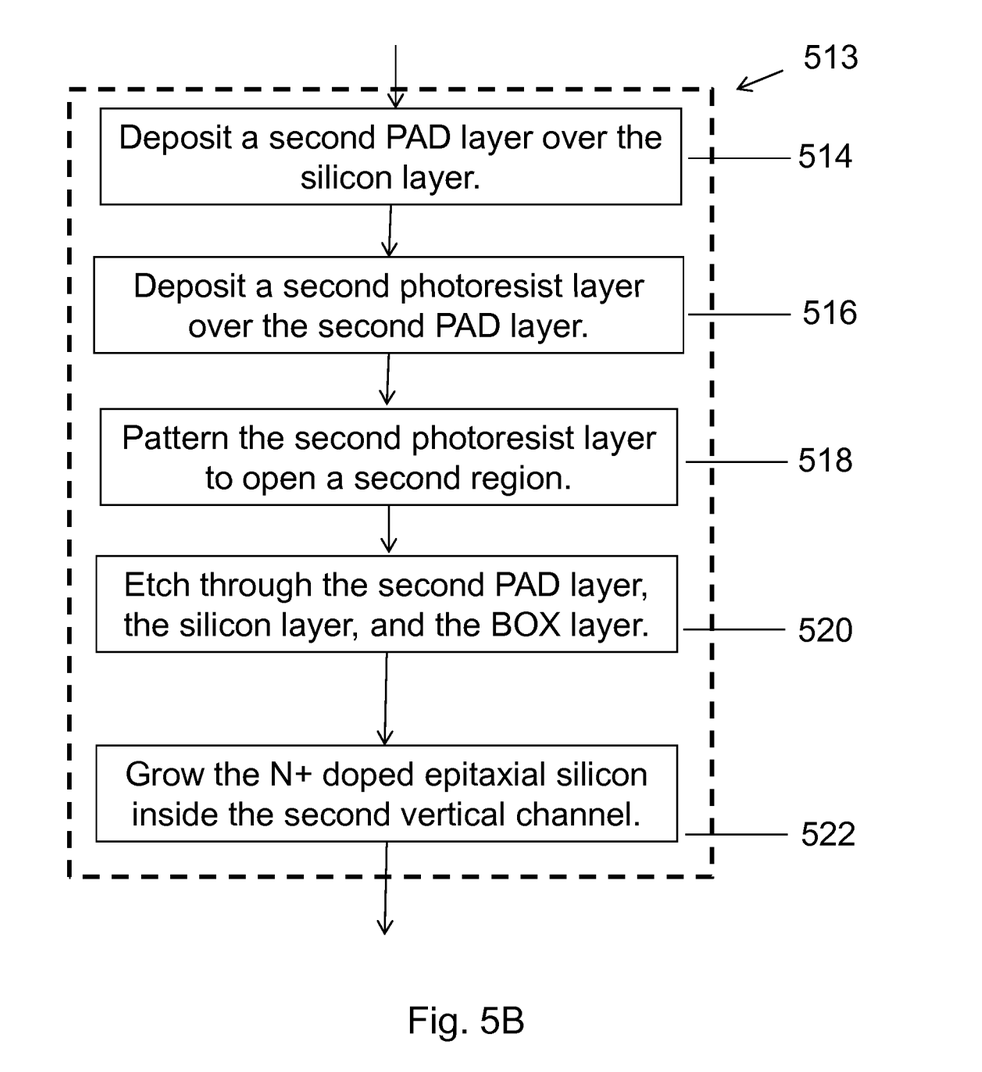
Figure 5C:
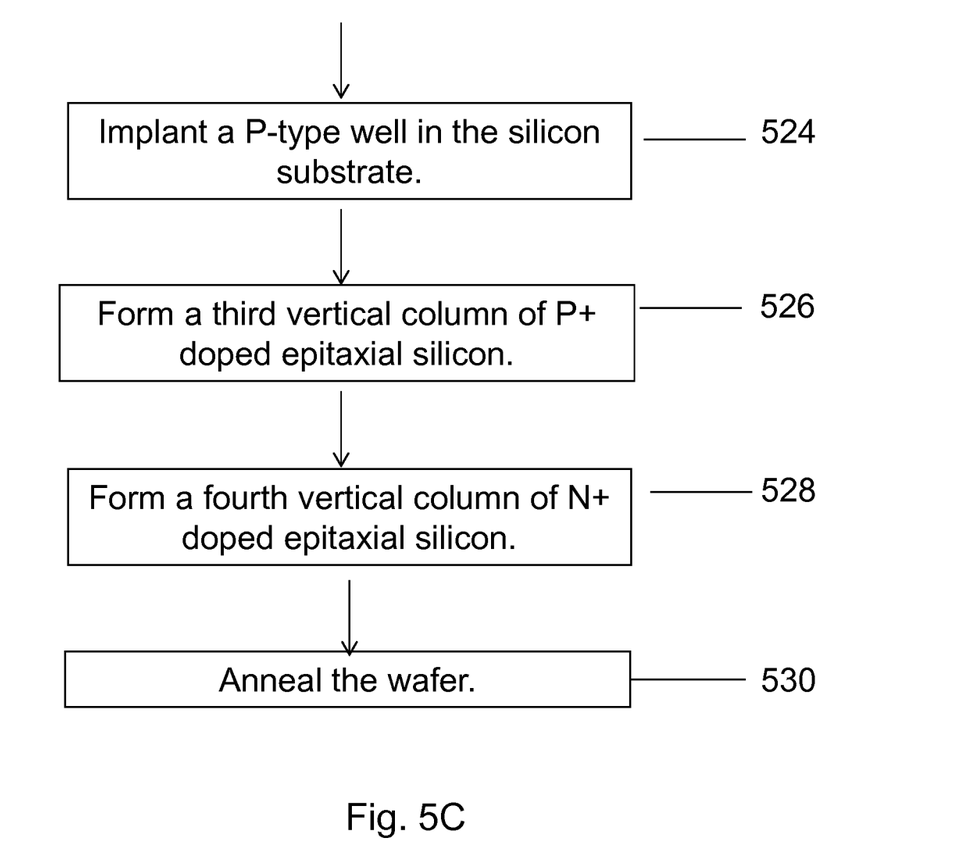

FIGS. 5A-5C shows a method for forming an electrostatic discharge resistant diode 100 in accordance with one embodiment of the present invention. The fabrication method includes a receiving step 502. During the receiving step 502, a wafer 102 is received. The wafer 102 includes a silicon layer 108 electrically isolated from a silicon substrate 114 by a buried oxide (BOX) layer 110. The BOX layer 110 is in physical contact with the silicon layer 108 and the silicon substrate 114. After the receiving step 502 is completed, the method continues to implanting step 504.

At implanting step 504, a N-type well 112 is implanted in the silicon substrate 114. In one embodiment, the N-type well 112 is implanted by implanting phosphorus ions with an energy level of about 250 KeV and a dose of approximately 5e12 to 1e13 atoms/cm$^2$. After implanting step 504 is completed, the method continues to forming step 505.

At forming step 505, a vertical column of P+ doped epitaxial silicon 116 is formed over the N-type well 112 and extends through the BOX layer 110 and the silicon layer 108. In one embodiment of the invention, forming step 505 includes depositing step 506. At depositing step 506, a first photoresist layer 104 is deposited over the first PAD layer 106. After depositing step 506 is completed, forming step 505 continues to patterning step 508.

At patterning step 508, the first photoresist layer 104 is patterned to open a first region in the first photoresist layer 104 above the N-type Well 112. After patterning step 508 is completed, forming step 505 continues to etching step 510.

At etching step 510, a first vertical channel over the N-type well 112 is formed by etching through the first PAD layer 106, the silicon layer 108, and the BOX layer 110. A reactive ion etching method may be used for the etching. After etching step 510 is completed, forming step 505 continues to growing step 512.

At growing step 512, a first vertical column of P+ doped epitaxial silicon 116 is grown inside the first vertical channel to the top horizontal surface of the silicon layer 108. The first photoresist layer 104 and the first PAD layer 106 are also removed. After forming step 505 is completed, the method continues to forming step 513.

At forming step 513, a second vertical column of N+ doped epitaxial silicon 117 is formed over the N-type well 112 and extend through the BOX layer 110 and the silicon layer 108. In one embodiment, forming step 513 includes depositing step 514. At depositing step 514, a second exposed oxide (PAD) layer 302 is deposited over the silicon layer 108. The thickness of the PAD layer may be in the range between 10 to 50 nm. After depositing step 512 is completed, forming step 513 continues to depositing step 516.

At depositing step 516, a second photoresist layer 306 is deposited over the second PAD layer 302. After depositing step 516 is completed, forming step 513 continues to patterning step 518.

At patterning step 518, the second photoresist layer 306 is patterned to open a second region, next to the first open region, in the second photoresist layer 306 above the N-type Well 112. After patterning step 518 is completed, forming step 513 continues to etching step 520.

At etching step 520, a second vertical channel over the N-type well 112 is formed by etching through the second PAD layer 302, the silicon layer 108, and the BOX layer 110. A reactive ion etching process may be used for the etching. After etching step 520 is completed, forming step 513 continues to growing step 522.

At growing step 522, a second vertical column of N+ doped epitaxial silicon 204 is grown inside the second vertical channel to the top horizontal surface of the silicon layer 108. The second photoresist layer 306 and the second PAD layer 302 are also removed. After forming step 513 is completed, the method may continue to annealing step 530 when forming an electrostatic discharge resistant diode 100 described above.

At annealing step 530, the wafer 102 is annealed. In one embodiment of annealing step 530, the temperature can be rapidly increased to approximate 1000 to 1100° C. in 5 to 30 seconds. During annealing step, the dopants in the first vertical column of P+ doped epitaxial silicon 116 and the second vertical column of N+ doped epitaxial silicon 117 may diffuse into the underneath N-type well 112. As a result, both columns may form electrical junctions with the underneath N-type well 112. After the annealing step 530 is completed, the method may continue with a standard FinFET process.

To form an electrostatic discharge resistant SCR 408 in accordance with one embodiment of the present invention, after forming step 513 is completed, the method continues to implanting step 524.

At implanting step 524, a P-type well 402 is implanted next to the N-type well 112 in the silicon substrate 114. In one embodiment, the P-type well 402 may be implanted by implanting boron ions with an energy level of about 250 KeV and a dose of approximately 5e12 to 1e13 atoms/cm$^2$. After implanting step 524 is completed, the method continues to forming step 526.

At forming step 526, a third vertical column of P+ doped epitaxial silicon 404 is formed over the P-type well 402 and extends through the BOX layer 110 and the silicon layer 108. After forming step 526 is completed, the method continues to forming step 528.

At forming step 528, a fourth vertical column of N+ doped epitaxial silicon 406 is formed over the P-type well 402 and extends through the BOX layer 110 and the silicon layer 108. After forming step 528 is completed, the method continues to annealing step 530. Annealing step 530 is described above. During annealing step 530, the dopants in the first vertical column of P+ doped epitaxial silicon 116, the second vertical column of N+ doped epitaxial silicon 117, the third vertical column of P+ doped epitaxial 404, and the fourth vertical column of N+ doped epitaxial silicon 406 may diffuse into the underneath N-type well 112 or P-type well 402 respectively. As a result, all the four columns may form junctions with the underneath N-type well 112 or P-well 402 respectively. After the annealing step 530 is completed, the fabrication process may continue with a standard FinFET process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic discharge resistant diode comprising:
   a wafer, the wafer including a silicon layer electrically isolated from a silicon substrate by a buried oxide (BOX) layer, a top surface of the BOX layer being in physical contact with the silicon layer and an opposite bottom surface of the BOX layer being in physical contact with the silicon substrate;

an N-type well in the silicon substrate;
a first vertical column of P+ doped epitaxial silicon over the N-type well and extending through the BOX layer and the silicon layer;
a second vertical column of N+ doped epitaxial silicon over the N-type well and extending through the BOX layer and the silicon layer; and
a dielectric layer in physical contact with the BOX layer, the first vertical column and second vertical column, the dielectric layer does not extend beyond and is parallel to the top surface of the BOX layer.

2. The electrostatic discharge resistant diode of claim 1, further comprising:
a P-type well, next to the N-type well, in the silicon substrate;
a third vertical column of P+ doped epitaxial silicon over the P-type well and extending through the BOX layer and the silicon layer; and
a fourth vertical column of N+ doped epitaxial silicon over the P-type well and extending through the BOX layer and the silicon layer.

3. The electrostatic discharge resistant diode of claim 1, wherein the BOX layer comprises silicon oxide.

4. The electrostatic discharge resistant diode of claim 1, wherein P+ doped epitaxial silicon comprises boron-doped epitaxial silicon.

5. The electrostatic discharge resistant diode of claim 1, wherein N+ doped epitaxial silicon comprises phosphorus-doped epitaxial silicon.

6. An electrostatic discharge resistant diode comprising:
a wafer, the wafer including a silicon layer electrically isolated from a silicon substrate by a buried oxide (BOX) layer, a top surface of the BOX layer being in physical contact with the silicon layer and an opposite bottom surface of the BOX layer being in physical contact with the silicon substrate;
an N-type well in the silicon substrate;
a first vertical column of P+ doped epitaxial silicon over the N-type well and extending through the BOX layer and the silicon layer, the first vertical column is in physical contact with the BOX layer and the N-type well; and
a second vertical column of N+ doped epitaxial silicon over the N-type well and extending through the BOX layer and the silicon layer, the second vertical column is in physical contact with the BOX layer and the N-type well; and
a dielectric layer over the BOX layer and in physical contact with the BOX layer, the first vertical column and second vertical column, the dielectric layer does not extend beyond and is parallel to the top surface of the BOX layer.

7. The electrostatic discharge resistant diode of claim 6, wherein the dielectric layer comprises silicon dioxide.

8. The electrostatic discharge resistant diode of claim 6, further comprising:
a P-type well, next to the N-type well, in the silicon substrate;
a third vertical column of P+ doped epitaxial silicon over the P-type well and extending through the BOX layer and the silicon layer; and
a fourth vertical column of N+ doped epitaxial silicon over the P-type well and extending through the BOX layer and the silicon layer.

9. The electrostatic discharge resistant diode of claim 6, wherein the BOX layer comprises silicon oxide.

10. The electrostatic discharge resistant diode of claim 6, wherein P+ doped epitaxial silicon comprises boron-doped epitaxial silicon.

11. The electrostatic discharge resistant diode of claim 6, wherein N+ doped epitaxial silicon comprises phosphorus-doped epitaxial silicon.

* * * * *